(12) United States Patent
Sekimoto et al.

(10) Patent No.: US 7,820,363 B2
(45) Date of Patent: Oct. 26, 2010

(54) PROCESS FOR FORMING A SOLDER MASK, APPARATUS THEREOF AND PROCESS FOR FORMING ELECTRIC-CIRCUIT PATTERNED INTERNAL DIELECTRIC LAYER

(75) Inventors: Akio Sekimoto, Reno, NV (US); Masayuki Michael Kojima, Dana Point, CA (US)

(73) Assignees: Taiyo America, Inc., Carson City, NV (US); Liquid Image Systems, Inc., Irvine, CA (US); Taiyo Ink Mfg. Co., Ltd., Tokyo (JP)

( * ) Notice: Subject to any disclaimer, the term of this patent is extended or adjusted under 35 U.S.C. 154(b) by 484 days.

(21) Appl. No.: 10/594,244

(22) PCT Filed: Mar. 23, 2004

(86) PCT No.: PCT/US2004/006090
§ 371 (c)(1),
(2), (4) Date: Sep. 25, 2006

(87) PCT Pub. No.: WO2005/104222
PCT Pub. Date: Nov. 3, 2005

(65) Prior Publication Data
US 2007/0141515 A1 Jun. 21, 2007

(51) Int. Cl.
*H01L 21/02* (2006.01)
*H01R 43/00* (2006.01)

(52) U.S. Cl. .................. 430/311; 430/330; 430/314; 29/825; 216/18; 174/254

(58) Field of Classification Search .................... None
See application file for complete search history.

(56) References Cited

U.S. PATENT DOCUMENTS 5,254,435 A 10/1993 Grandmont et al.
6,329,123 B1 * 12/2001 Lundy et al. ............. 430/284.1

FOREIGN PATENT DOCUMENTS

CN 1140973 A 1/1997
JP 2003-167336 6/2003

* cited by examiner

*Primary Examiner*—Daborah Chacko Davis
(74) *Attorney, Agent, or Firm*—Oblon, Spivak, McClelland, Maier & Neustadt, L.L.P.

(57) ABSTRACT

In a process for forming a solder mask, a photoimageable ink is coated on a carrier film to form a photoimageable ink layer on the carrier film. The photoimageable ink layer is dried to form a photoimageable resist layer, thereby forming at least one photoimageable resist layer bearing film. The photoimageable resist layer bearing film is laminated on at least one side of a substrate so as to bring the upper surface of the photoimageable resist layer into contact with the substrate. The photoimageable resist layer is exposed to light imagewise through the carrier film. The carrier film is removed from the photoimageable resist layer to form an exposed resist layer. The exposed resist layer is developed to form a developed resist layer. The developed resist layer is cured to form a solder mask on the substrate.

27 Claims, 15 Drawing Sheets

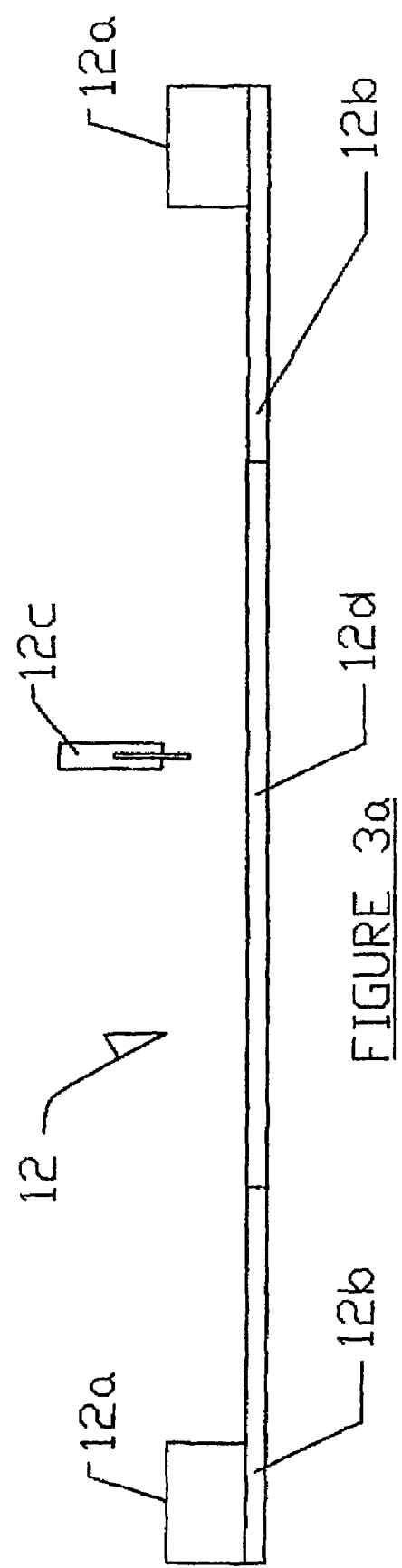

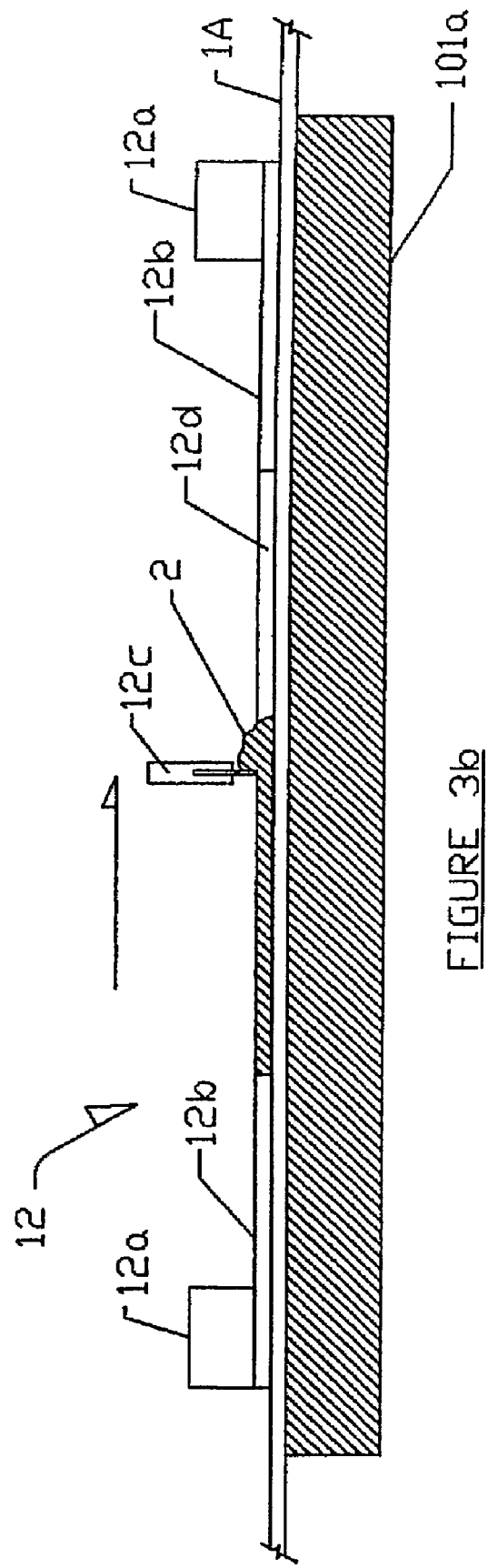

PROCESS FOR FORMING A SOLDER MASK, APPARATUS THEREOF AND PROCESS FOR FORMING ELECTRIC-CIRCUIT PATTERNED INTERNAL DIELECTRIC LAYER

BACKGROUND OF THE INVENTION

1. Field of the Invention

The present invention relates to a process for forming a solder mask for the fabrication of printed circuit boards or wiring boards or the like, and an apparatus for carrying out the process for forming the solder mask. The present invention also relates to a process for forming an internal dielectric layer provided with an electric-circuit pattern.

2. Description of the Background Art

In the printed circuit or wiring board industry, for example, a solder mask ink is increasingly used for the fabrication of printed circuit boards (PCBs) or wiring boards, driven by the increased demand for the miniaturization of various devices, which necessitates the use of high-density circuitry in printed circuit boards or printed wiring boards.

Furthermore, in accordance with the demand for the miniaturization of various devices, many of parts to be mounted thereon are of a ball grid array (BGA) type, and accordingly more and more strict requirements are being demanded for PCBs.

Under such circumstances, for instance, a liquid alkaline development type solder mask ink is currently in general use for the formation of solder masks for PCBs, and a so-called "dry film" is also used therefor. In the formation of solder masks, for example, the following requirements are demanded for the solder mask of PCBs:

1. Filling of blind via-holes and through-holes and tenting thereof be complete.
2. The flatness of the solder mask after the formation thereof be as high as possible, for instance, ±5 μm or less.
3. Problems such as a so-called "white haze" problem be not caused when a non-contact type exposure unit and a photographic dry plate are used, which are for attaining high resolution and high precision exposure.

Complete filling of blind via-holes and through-holes and 100% tenting are difficult to attain by coating on the PCBs the liquid alkaline development type solder mask ink, even though such a liquid solder mask ink is currently coated by various coating methods such as screen printing, curtain coating, spray coating, and roll coating. In contrast to this, complete filling and tenting can be almost carried out by laminating a dry film on PCBs by use of a vacuum laminator.

As to the flatness of the solder mask after the formation thereof, it is difficult to attain the required flatness by use of the solder mask ink due to the presence of copper patterns and via-holes in the PCBs. In contrast to this, the dry film can attain the required flatness.

The currently available alkaline development type solder mask ink utilizes radical polymerization and therefore unless it is protected from oxygen, oxygen hindrance to the formation of solder mask takes place. More specifically, when the alkaline development type solder mask ink is exposed to oxygen, the surface of the solder mask formed become white in color and the function of the solder mask is impaired. This problem is referred to as "white haze" phenomenon.

In order to avoid such oxygen hindrance, a negative film is used since it can be brought into close contact with the coated solder mask ink, and therefore the coated solder mask ink can be protected from oxygen. However, for the purpose of obtaining high resolution and high precision exposure, the negative film is not always suitable since the negative film itself elongates or shrinks while in use and causes a problem with positional accuracy and precision in the formation of a solder mask.

In order to attain high resolution and high precision exposure by avoiding the problem with positional accuracy and precision of exposure, a non-contact exposure unit such as a step-and-repeat type non-contact exposure unit and a photographic dry plate are considered to be preferable for use. However, when the non-contact exposure unit and the photographic dry plate are used, a certain space is inevitably formed between the dry plate and the coated solder mask ink. This space causes the above-mentioned oxygen hindrance.

In this sense, the solder mask ink in current use is not suitable for the formation of a solider mask with high resolution and high precision, particularly when the non-contact exposure unit and the photographic dry plate are used. In contrast to this, the dry film has almost no problem with respect to the formation of a solder mask with high resolution and high precision, since the dry film is protected from oxygen while in use for the fabrication of the solder mask.

When the solder mask ink is used, a solder mask is generally prepared, for example, by the steps of coating the solder mask ink onto a PCB, drying the coated solder mask ink to form a photoimageable resist layer on the PCB, exposing the photoimageable resist layer imagewise so as to correspond to a solder mask to be formed, developing the exposed photoimageable resist layer to a developed resist layer, and thermally curing the developed resist layer to form a solder mask on the PCB.

Such a solder mask ink can be used for 6 months when preserved in the dark at temperatures below 20° C. When the solder mask ink is used, the work size and the thickness of the solder mask can be changed as desired. However, as mentioned above, when such a solder mask ink is used, complete filling of through-holes and blind via-holes with the ink is difficult to perform, and complete tenting of through-holes is also difficult to perform. Furthermore, the formation of voids is inevitable.

The flatness obtained by the use of the solder mask ink is in the range of ±20 μm or more. Furthermore, as mentioned above, when a non-contact exposure apparatus and a photographic dry plate are used, the surface of the solder mask tends to be whitened due to the above-mentioned "white haze" phenomenon which is caused by the oxygen hindrance.

A dry film which is currently commercially available has a multi-layered structure as shown in FIG. 11, and such a dry film, when commercially supplied, is in the form of a roll film.

In FIG. 11, reference numeral 10 indicates a carrier film, which may be made of, for example, a polyester film; reference numeral 20, a resist layer which may be, for example, a polymerizable layer serving as a photoimageable solder mask layer; and reference numeral 30, a protective layer for protecting the resist layer 20, which protective layer may be, for example, a polyethylene film.

Generally, such a dry film roll is preserved in the dark in a frozen state, for example, at −20° C., and is thawed out before use.

When such a dry film is used in practice, for example, the following steps are generally taken:

To begin with, the frozen dry film is thawed out as mentioned above. When the temperature thereof has reached, for example, room temperature, the protective layer 30 is peeled away from the resist layer 20.

A portion with a desired size is then cut off the dry film from which the protective layer 30 has been peeled away.

The cut portion is then superimposed on a PCB in such a manner that the upper surface of the resist layer 20 comes into contact with the PCB, and one end portion 20c of the resist layer 20 is tacked to the PCB by a tack bar B as shown in FIG. 13.

The resist layer 20 is then exposed to light imagewise corresponding to a solder mask to be formed through the carrier film 10. The carrier film 10 is then peeled away from the resist layer 20. The exposed resist layer 20 is then preheated, cooled to room temperature, and developed by spraying thereon an aqueous solution of sodium carbonate, followed by washing the resist layer 20 with water by spraying water thereon. The thus developed resist layer 20 is then thermally cured, whereby a solder mask is formed on the PCB.

Generally, such a dry film is usable for 3 months when preserved in the dark at temperatures below −20° C., for 2 months when preserved in the dark at temperatures below 0° C., and only for 2 days when preserved in the dark at temperatures below 20° C.

When such a dry film is used, complete filling of through-holes and blind via-holes and complete tenting of through-holes are possible, without the formation of voids.

The flatness obtained by the use of the dry film is in the range of ±5 μm or less. Even when the non-contact exposure apparatus or the photographic dry plate is used, no "white haze" phenomenon takes place.

However, the work size and the thickness of the solder mask cannot be changed easily as desired. In order to change the work size and the thickness of the solder mask, a number of different dry films are needed. Changing the work size and the thickness of the solder mask by use of a number of different dry films is not a practical procedure.

SUMMARY OF THE INVENTION

According to one aspect of the present invention, a process for forming a solder mask includes coating a photoimageable ink on a carrier film to form a photoimageable ink layer on the carrier film, drying the photoimageable ink layer to form a photoimageable resist layer, thereby forming at least one photoimageable resist layer bearing film, laminating the photoimageable resist layer bearing film on at least one side of a substrate so as to bring the upper surface of the photoimageable resist layer into contact with the substrate, exposing the photoimageable resist layer to light through the carrier film to form an exposed resist layer, removing the carrier film from the exposed resist layer, developing the exposed resist layer to form a developed resist layer, and curing the developed resist layer to form a solder mask on the substrate.

According to another aspect of the present invention, an apparatus for forming a solder mask includes a coater, a dryer, a laminating device, an exposing unit, a remover, a developing unit, and a curing unit. A photoimageable ink is to be coated with the coater on a carrier film to form a photoimageable ink layer on the carrier film. The dryer is configured to dry the photoimageable ink layer to form a photoimageable resist layer, thereby forming at least one photoimageable resist layer bearing film. The photoimageable resist layer bearing film is to be lamionated with the laminating device on at least one side of a substrate so as to bring the upper surface of said photoimageable resist layer into contact with the substrate. The exposing unit is configured to expose the photoimageable resist layer to light through the carrier film to form an exposed resist layer. The carrier film is to be removed with the remover from the exposed resist layer. The developing unit is configured to develop the exposed resist layer to form a developed resist layer. The curing unit is configured to cure the developed resist layer to form a solder mask on the substrate.

According to the other aspect of the present invention, a process for forming an internal dielectric layer provided with an electric-circuit pattern includes coating a dielectric material ink on a carrier film to form a dielectric material ink layer on the carrier film, drying the dielectric material ink layer to form a dielectric material layer, thereby forming at least one dielectric layer bearing film, laminating the dielectric material layer bearing film on at least one side of a substrate so as to bring the upper surface of the dielectric material layer into contact with the substrate, thermally curing the dielectric material layer to form a cured dielectric material layer, removing the carrier film from the cured dielectric material layer, subjecting the cured dielectric material layer to laser drilling to form a laser-drilled cured dielectric material layer with a drilled electric-circuit pattern, subjecting the laser-drilled cured dielectric material layer to desmear etching, and plating the laser-drilled cured dielectric material layer with an electroconductive material, thereby forming an internal dielectric layer provided with an electric-circuit pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3a to 3c are schematic cross-sectional views of the stencil printing unit shown in FIG. 2 in explanation of an example of a stencil printing process used in the first embodiment of the present invention;

DESCRIPTION OF THE EMBODIMENTS

Figure 1:
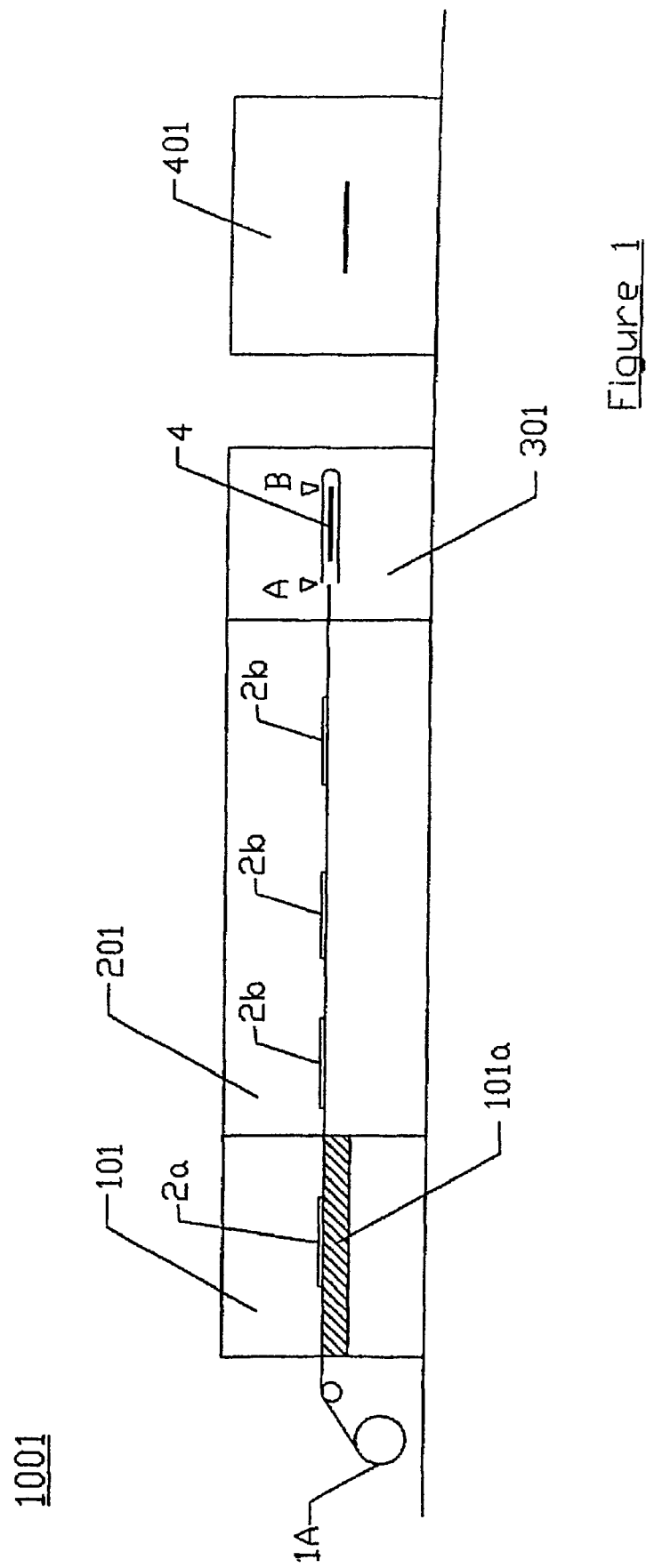
FIG. 1 is a schematic illustration of an apparatus for carrying out a process for forming a solder mask according to a first embodiment of the present invention.

The embodiments will now be described with reference to the accompanying drawings, wherein like reference numerals designate corresponding or identical elements throughout the various drawings.

EXAMPLE 1

FIG. 1 schematically shows an apparatus 1001 for carrying out a process for forming a solder mask according to a first embodiment of the present invention.

In the apparatus 1001, a carrier film 1A is released from a commercially available carrier film roll (LUMIRROR T-60, made by Toray Industries, Inc., a biaxially oriented polyester film with a film thickness of 38 μm) and transported onto a horizontal, porous vacuum table 101a in a coating chamber 101.

A commercially available photoimageable ink 2 (PSR-4000BN/CA-40BN, a two-component liquid photoimageable ink, made by TAIYO AMERICA, INC.) is coated onto the carrier film 1A by stencil printing, using a stencil printing unit 12 as shown in FIG. 2 and FIGS. 3a to 3c.

Figure 2:
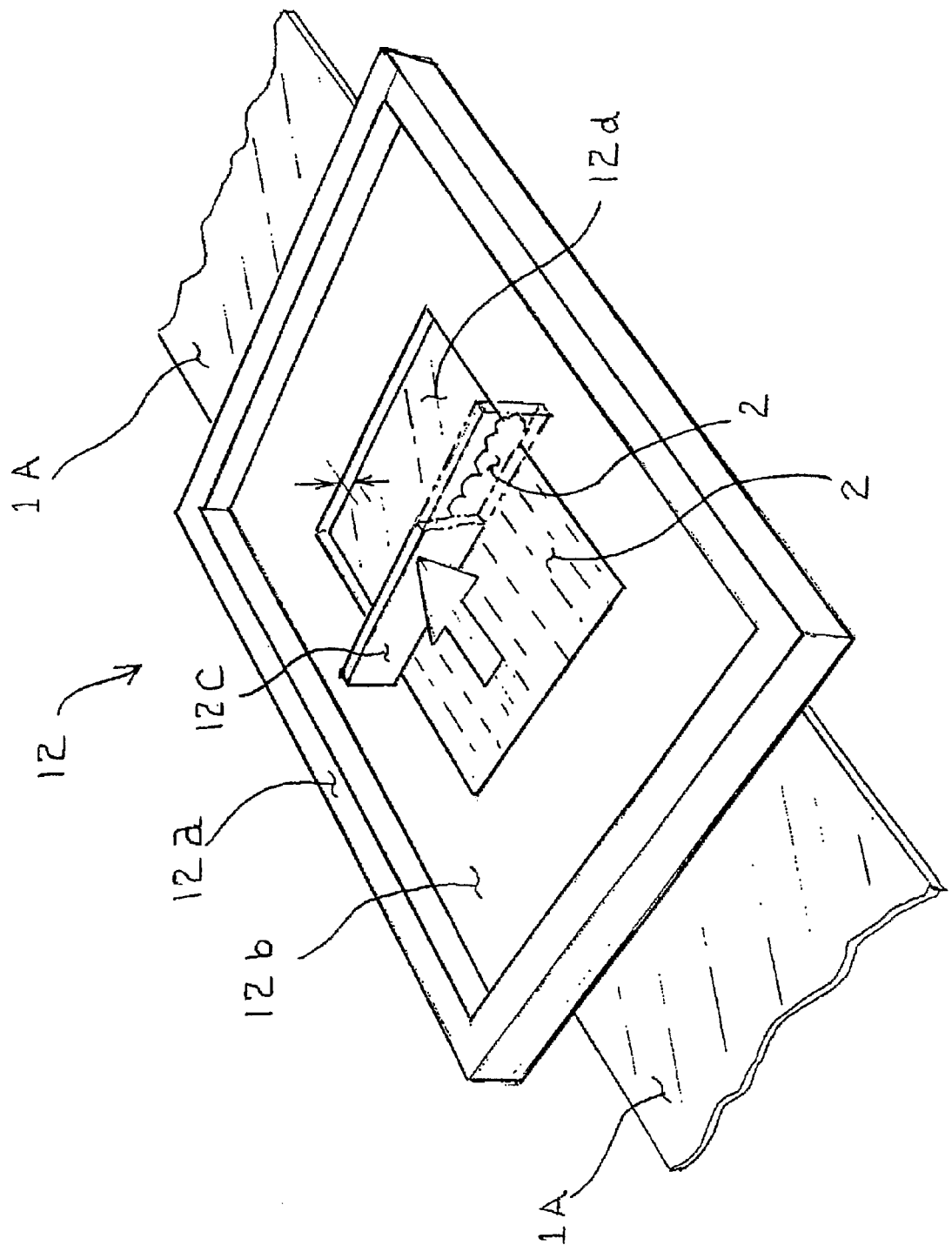
FIG. 2 is a schematic perspective view of a stencil printing unit used in the first embodiment of the present invention.

In FIG. 2, reference numeral 12a indicates a stencil frame of the stencil printing unit 12; reference numeral 12b indicates a metal stencil board of the stencil printing unit 12, which metal stencil board 12b has a thickness t of 100 μm; reference numeral 12d indicates a stencil opening formed in the metal stencil board 12b.

In this Example 1, the above-mentioned stencil printing is carried out by squeezing and transferring the photoimageable ink 2 onto the carrier film 1A through the stencil opening 12d by a scraper 12c which is moved in the direction of the arrow along the upper surface of the metal stencil board 12b as shown in FIG. 2.

Figure 3C:
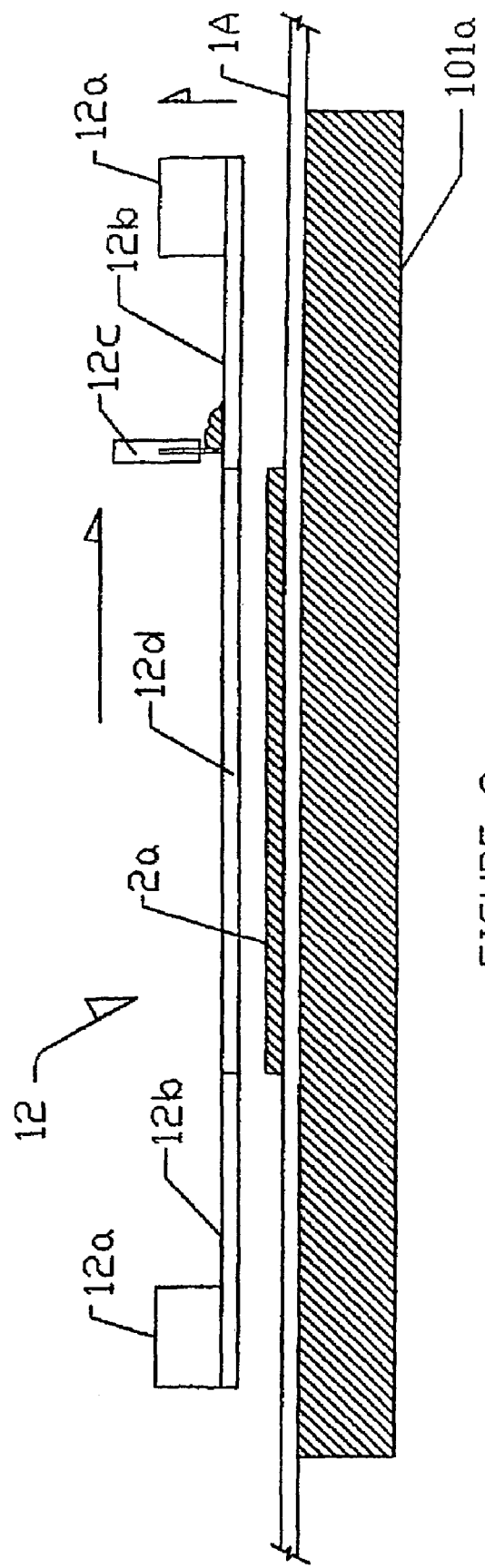

FIGS. 3a to 3c show a schematic cross-sectional view of the stencil printing unit 12 in explanation of the above-mentioned stencil printing employed in the Example 1. As shown in FIG. 3b, the scraper 12c is moved in the direction of the arrow along the upper surface of the metal stencil board 12b, so that the photoimageable ink 2 is squeezed and transferred onto the carrier film 1A by the scraper 12c through the stencil opening 12d. When the photoimageable ink 2 is completely transferred onto the carrier film 1A, the stencil printing unit 12 is lifted up in the direction of the arrow as shown in FIG. 3c, so that the metal stencil board 12b is separated from the carrier film 1A, while a photoimageable ink layer portion 2a is extracted from the stencil opening 12d and stays on the carrier film 1A as shown in FIG. 3c. The photoimageable ink layer portion 2a corresponds in shape to the stencil opening 12d.

Figure 4:
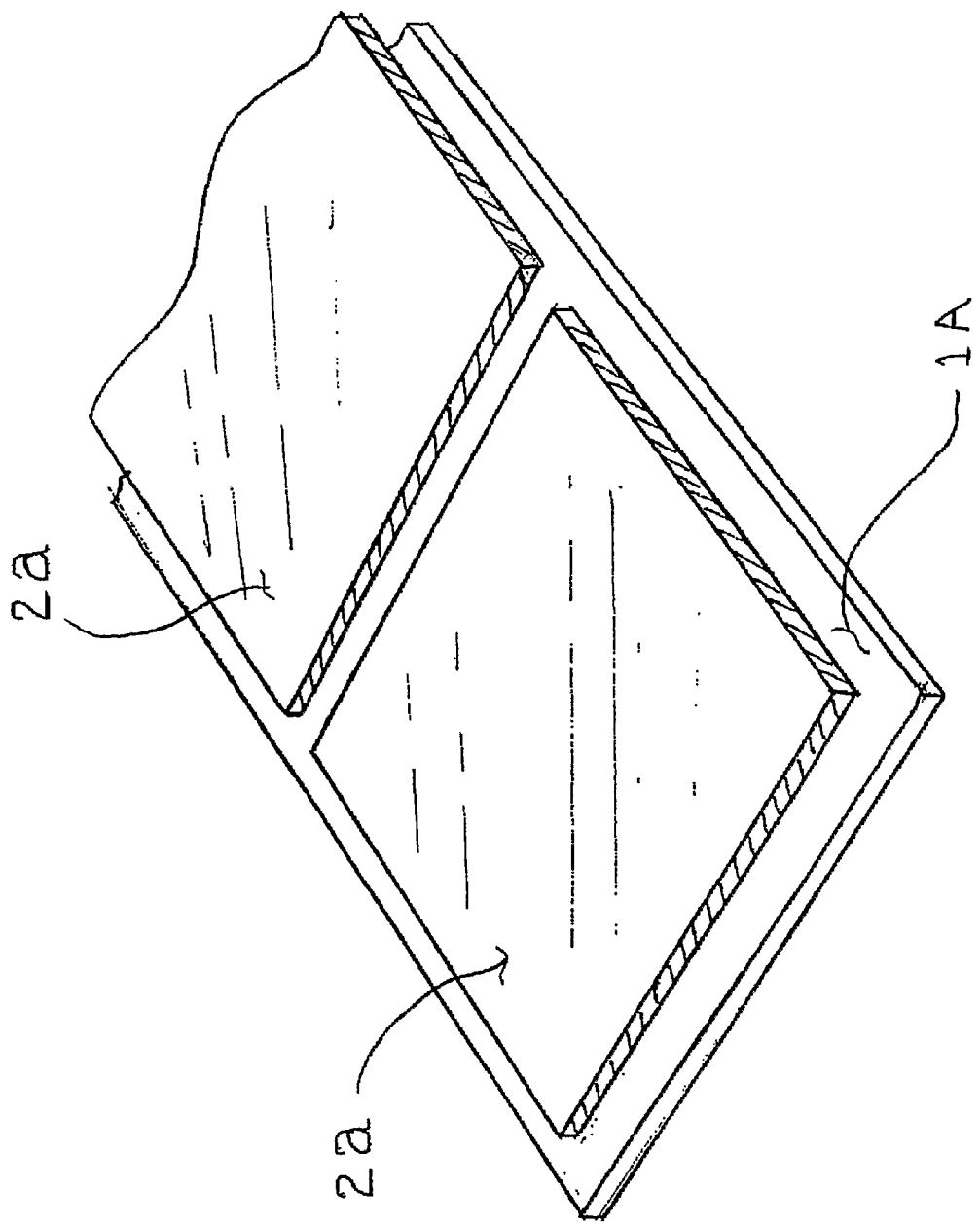
FIG. 4 is a schematic perspective view of photoimageable ink layer portions formed on a carrier film in the first embodiment of the present invention.

FIG. 4 is a schematic perspective view of the photoimageable ink layer portion 2a formed on the carrier film 1A.

This stencil printing process is repeated so that a plurality of photoimgeable ink layer portions 2a is successively formed with a predetermined space therebetween on the carrier film 1A as shown in FIGS. 1 and 4.

The carrier film 1A which bears thereon a plurality of the photoimageable ink layer portions 2a is then transported into a drying chamber 201 as shown in FIG. 1. In the drying chamber 201, the photoimageable ink layer poritions 2a formed on the carrier film 1A are dried at 80° C. for 30 minutes, whereby photoimageable resist layer portions 2b with a thickness of 50 μm to 60 μm are formed.

The thus formed photoimageable resist layer portions 2b formed on the carrier film 1A are then cooled to room temperature after the above-mentioned drying step.

Figure 5:
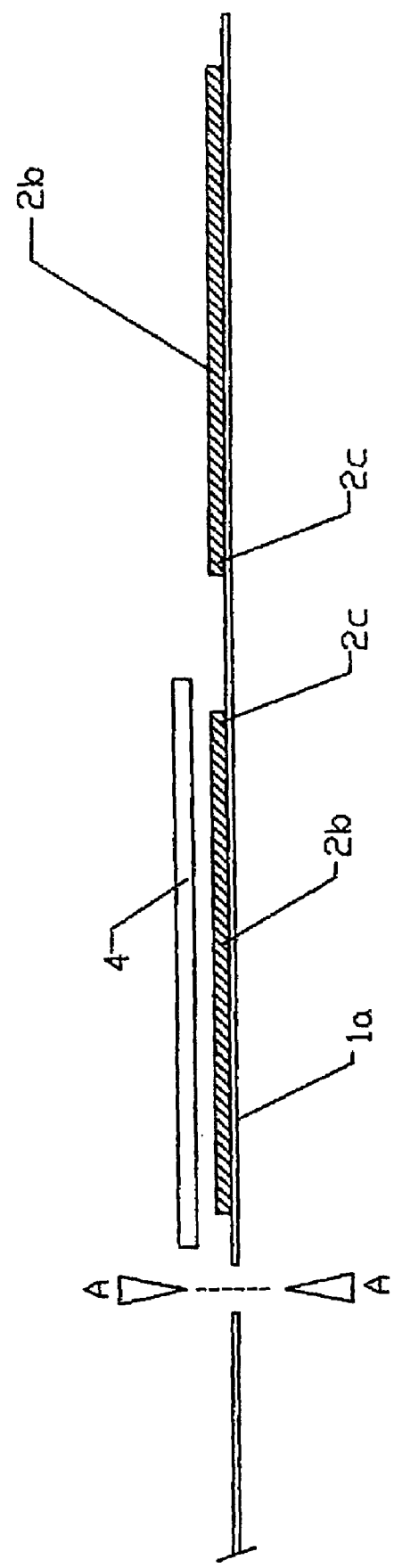
FIG. 5 is a schematic cross-sectional view of an example of a photoimageable resist layer bearing film portion in the first embodiment of the present invention.

As shown in FIG. 5, the leading edge portion of the carrier film 1A is then cut by a cutter A into a unit carrier film portion with a predetermined length, which bears thereon a pair of the photoimageable resist layer portions 2b. This cutting is carried out in a cutting and tacking chamber 301 by the cutter A as shown in FIG. 1.

The unit carrier film portion which bears thereon a pair of the photoimageable resist layer portions 2b is hereinafter referred to as a photoimageable resist layer bearing film portion 1a as shown in FIG. 5.

Figure 6:
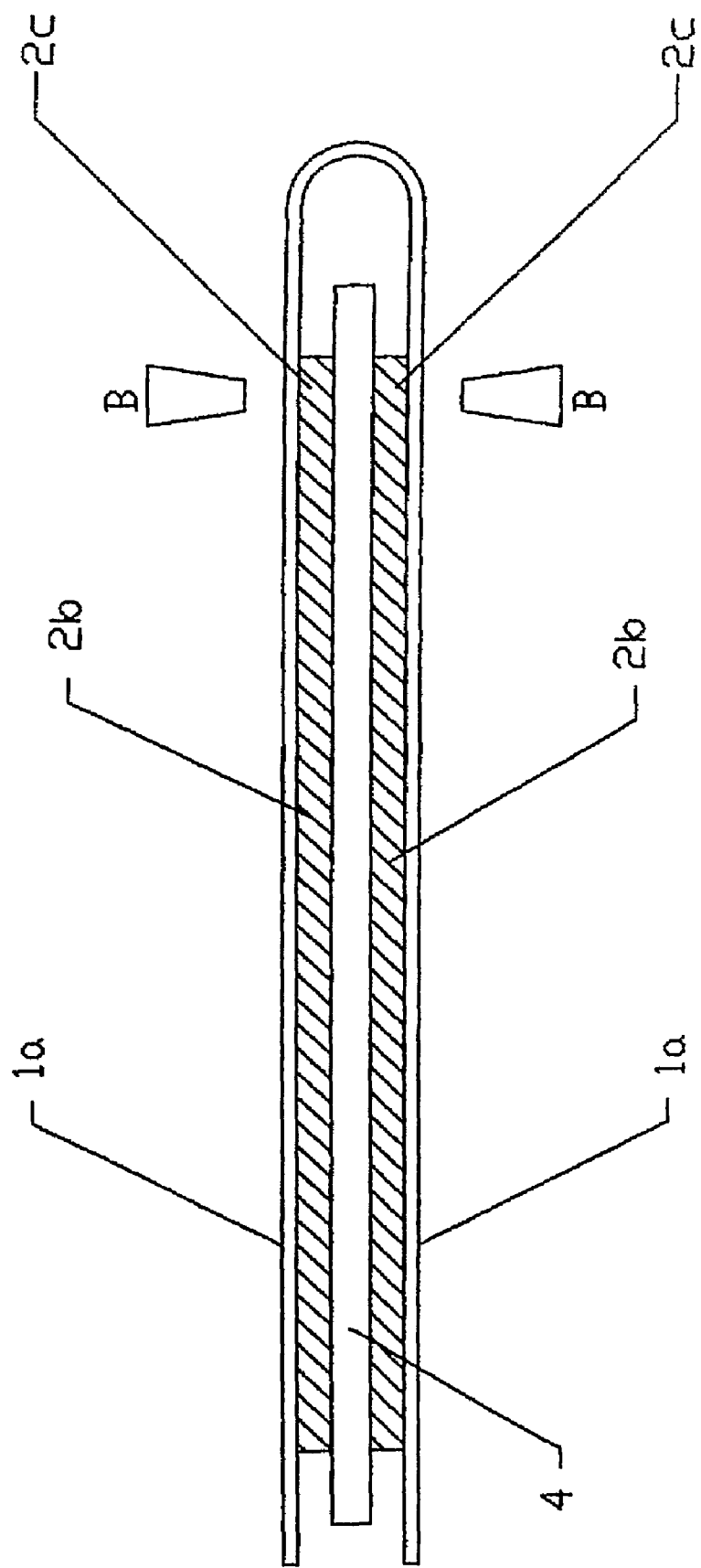
FIG. 6 is a schematic cross-sectional view of the photoimageable resist layer bearing film portion shown in FIG. 5, which is folded in two so as to interpose a pattern-formed PCB therebetween.

The photoimageable resist layer bearing film portion 1a is then folded in two, an upper portion and a lower portion, each portion bearing thereon one photoimageable resist layer portion 2b, and a pattern-formed PCB printed circuit board) 4 is sandwiched between the pair of the photoimageable resist layer portions 2b as shown in FIG. 6.

An end portion 2c of each of the upper and lower photoimageable resist layer portions 2b is then tacked to the PCB 4 by a tack bar B as shown in FIG. 6. This tacking is carried out in the cutting and tacking chamber 301 by the tack bar B as shown in FIG. 1.

The PCB 4, sandwiched between the upper and lower photoimageable resist layer portions 2b, is then transported into a vacuum laminator chamber 401 as shown in FIG. 1. In the vacuum laminator chamber 401, the photoimageable resist layer portions 2b are laminated on the PCB 4 by a vacuum laminator (VACUUMEX, made by Morton Co. Ltd.) (not shown) at 70° C. for 60 seconds.

The photoimageable resist layer portions 2b which are laminated on both sides of the PCB 4 are then exposed to light imagewise, for instance, corresponding to a solder mask to be formed, with the application of exposure energy of 350 mJ/cm$^2$ thereto through the carrier film portion of the photoimageable resist layer bearing film portion 1a by a commercially available exposure unit (ORC MODEL HMW680GW EXPOSURE UNIT) (not shown), whereby exposed resist layer portions are formed.

The carrier film portion of the photoimageable resist layer bearing film portion 1a is then peeled away from the imagewise exposed resist layer portions. The exposed resist layer portions are then allowed to stand for 10 minutes, and then developed by spraying thereon a 1 wt.% aqueous solution of sodium carbonate at 30° C. with a spray pressure of 2 MPs for 60 seconds, and are then washed with water by spraying water thereon with a spraying pressure of 1 MPs for 45 seconds, whereby developed resist layer portions are formed.

The thus developed resist layer portions formed on the PCB 4 are then cured at 150° C. for 60 minutes, whereby a solder mask is formed on each of the opposite sides of the PCB 4.

In the thus fabricated PCB 4 with the solder mask formed on both sides thereof, the filling of blind via-holes and through-holes is found complete and 100% tenting is attained.

Furthermore, the flatness of the solder mask is ±5 μm or less, and there is no "white haze" problem even when a non-contact type exposure unit and a photographic dry plate are used for attaining high resolution and high precision exposure.

In the above-mentioned first embodiment, for instance, the stencil opening formed in the metal stencil board 12b can be changed in shape and size as desired by use of a suitable stencil printing unit therefor, so that the photoimageable resist layer portion 2b can also be changed in shape and size as desired. In other words, the photoimageable resist layer portions 2b can be prepared in all shapes and sizes.

Furthermore, in the above first embodiment, the 100 μm thick stencil board 12 is used in the stencil printing unit 12. However, the thickness "t" can also be changed as desired, so that the thickness of the photoimageable resist layer portions 2b can also be changed as desired.

Furthermore, by replacing the photoimageable ink 2 with a different photoimageable ink, or by use of two or more different photoimageable inks, for instance, alternatively, a variety of solder masks can be formed, for instance, on the PCB 4, with a different solder mask on each side of the PCB 4.

Furthermore, in this first embodiment, the photoimageable resist layer bearing film portion 1a bears a pair of photoimageable resist layer portions 2b. However, the number of the photoimageable resist layer portions 2b to be formed on the photoimageable resist layer bearing film portion 1a is not necessarily limited to 2 as in Example 1, but the desired number of the photoimageable resisti layer portions 2b may be provided. Different inks may also be used thererfor, if necessary.

Furthermore, in the above-mentioned first embodiment, the lamination may be carried out either simultaneously or successively on both sides of the PCB 4.

The above-mentioned changes or modifications to the process can be made either before starting the process for the formation of the solder mask or in the course of the process.

In the case of a conventional so-called dry film, such changes or modifications to the process as mentioned above are practically difficult to carry out. This is because a conventional so-called dry film includes a carrier film, a resist layer formed thereon and a protective layer formed on the resist layer, and the resist layer is already made with a predetermined formulation and with a predetermined thickness, sandwiched between the carrier film and the protective film, before use, as described previously. Furthermore, the conventional so-called dry film is commercially available in the form of a roll preserved in a frozen state, generally at −20° C., and it is thawed out before use and is used in a predetermined period of time, usually within one day or two days at room temperature, after it has been thawed out.

EXAMPLE 2

Figure 7:
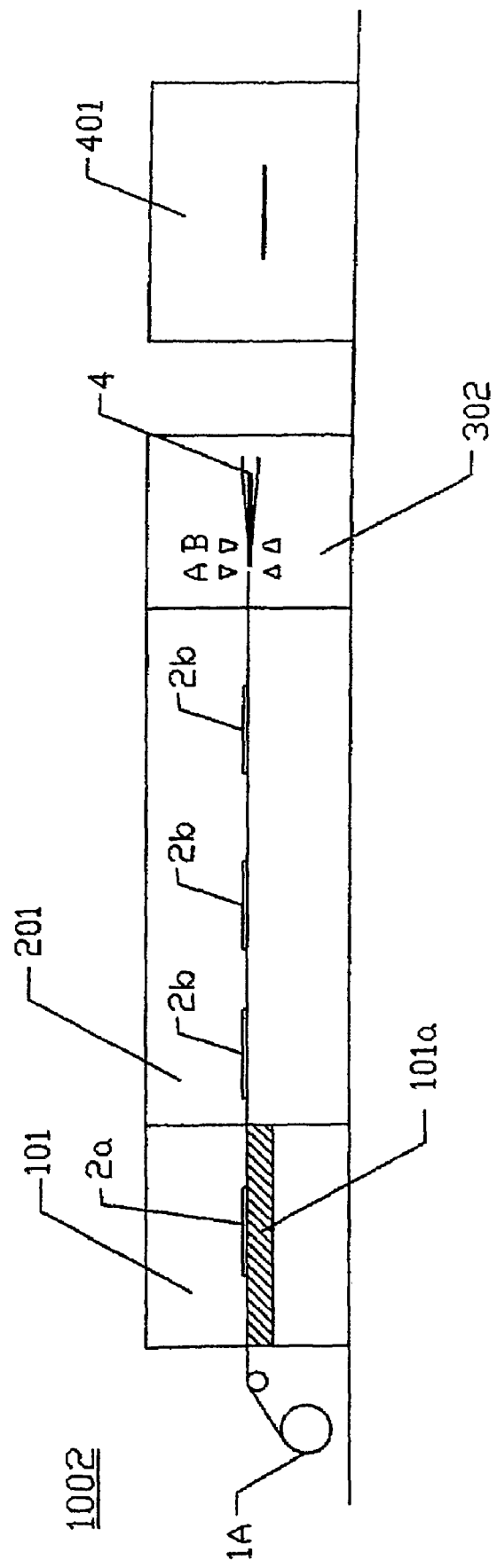
FIG. 7 is a schematic illustration of an apparatus for carrying out a process for forming a solder mask according to a second embodiment of the present invention.

FIG. 7 schematically shows an apparatus 1002 for carrying out the process for forming a solder mask according to a second embodiment of the present invention.

The apparatus 1002 includes a film cutting and tacking chamber 302, while the apparatus 1001 in the first embodiment includes the film cutting and tacking chamber 301.

In this embodiment of the present invention, substantially the same steps as in the first embodiment is carried out in the coating chamber 101 and the drying chamber 201, so that the same photoimageable resist layer portions 2b are formed on the carrier film 1A in the drying chamber 201. The photoimageable resist layer portions 2b are then cooled to room temperature in the same manner as in the Example 1.

Figure 8:
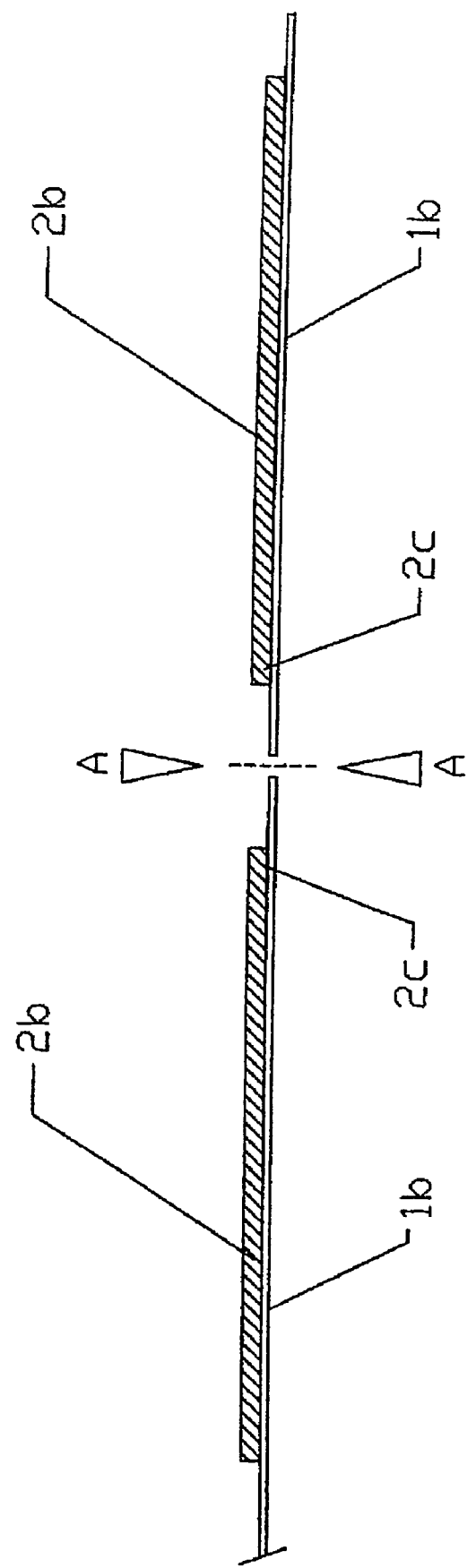
FIG. 8 is a schematic cross-sectional view of a photoimageable resist layer bearing film portion in the second embodiment of the present invention.

The carrier film 1A is then successively cut off by a cutter A in such a manner that each cut portion of the carrier film 1A bears thereon one photoimageable resist layer portion 2b as shown in FIG. 8, which cut portion is hereinafter referred to as a photoimageable resist layer bearing film portion 1b. This cutting is carried out in the cutting and tacking chamber 302 by the cutter A as shown in FIG. 7.

Figure 9:
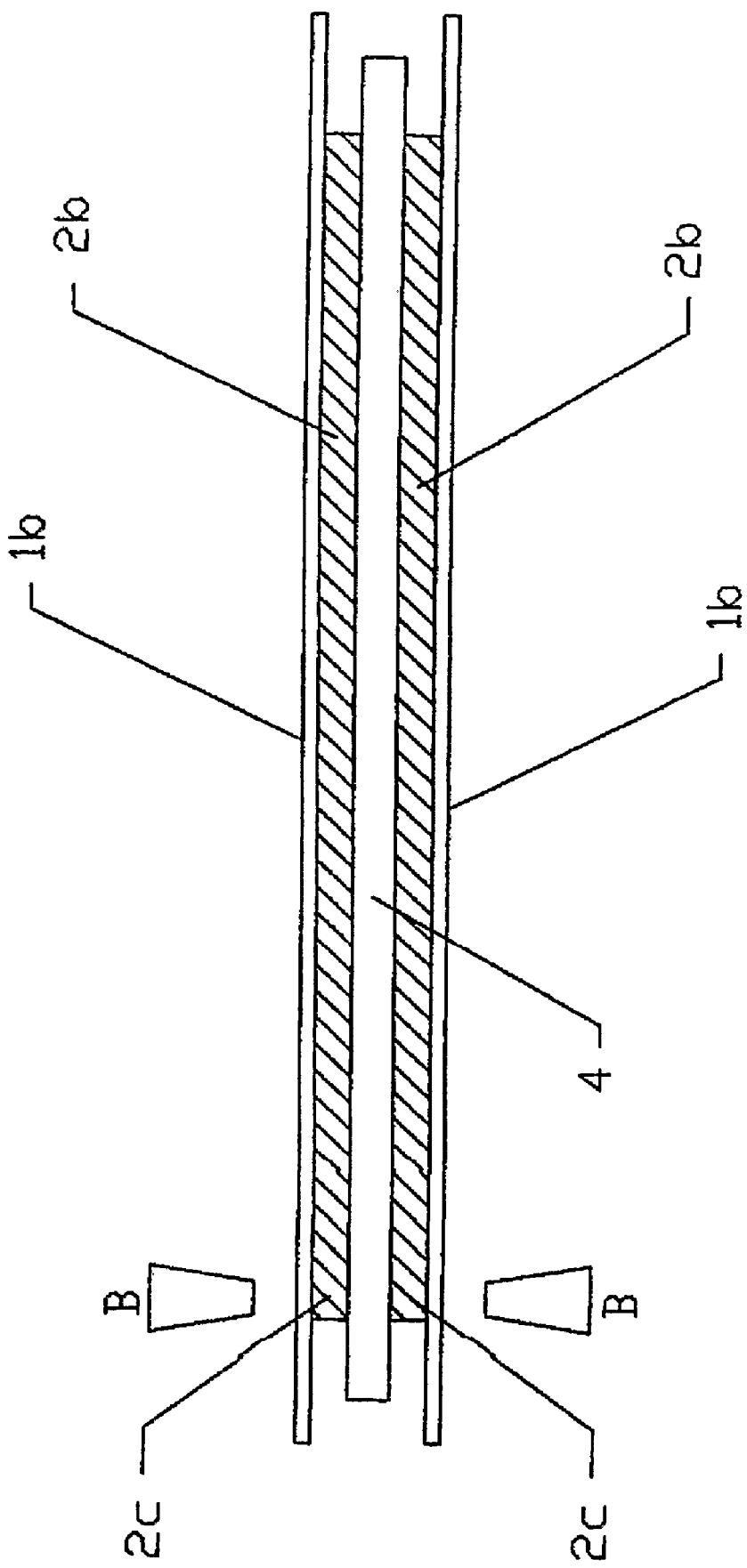
FIG. 9 is a schematic cross-sectional view of a pair of the photoimageable resist layer bearing film portions shown in FIG. 8, between which a pattern-formed PCB is interposed.

A pair of the photoimageable resist layer bearing film portions 1b are then transported onto a pattern-formed PCB 4, with one of the photoimageable resist layer bearing film portions 1b being turned reversely so as to cause the upper surface of each of the photoimageable resist layer portions 2b to come into close contact with both sides of the pattern-formed PCB 4, whereby the pattern-formed PCB 4 is sandwiched therebetween as shown in FIG. 9.

An end portion 2c of each of the photoimageable resist layer portions 2b is tacked to the PCB 4 by a tack bar B as shown in FIG. 9. This tacking is carried out in the cutting and tacking chamber 302 by the tack bar B as shown in FIG. 7.

The PCB 4 interposed between a pair of the photoimageable resist layer portions 2b is then transported into the vacuum laminator chamber 401 as shown in FIG. 7. In the vacuum laminator chamber 401, the photoimageable resist layer portions 2b are laminated on the PCB 4 by the same vacuum laminator (VACUUMEX, made by Morton Co. Ltd.) (not shown) as used in Example 1 at 70° C. for 60 seconds in the same manner as in Example 1.

The photoimageable resist layer portions 2b laminated on both sides of the PCB 4 are then exposed to light imagewise, corresponding to a solder mask to be formed, with the application of exposure energy of 350 mJ/cm$^2$ thereto through the carrier film portion of each of the photoimageable resist layer bearing film portion 1b by the same commercially available exposure unit (ORC MODEL HMW680GW EXPOSURE UNIT) (not shown) as used in Example 1 in the same manner as in Example 1, whereby exposed resist layer portions are formed.

Each of the upper and lower carrier film portions is then peeled away from the imagewise exposed resist layer portions. The imagewise exposed resist layer portions are then allowed to stand for 10 minutes, and then developed in the same manner as in Example 1.

The thus developed resist layer portions formed on the PCB 4 are also cured in substantially the same manner as in Example 1, whereby a solder mask is formed on each of the opposite sides of the PCB 4.

In the thus fabricated PCB 4 with the solder mask formed on both sides thereof, the filling of blind via-holes and through-holes is found complete and 100% tenting is attained.

Furthermore, the flatness of the solder mask is ±5 μm or less, and there is no "white haze" problem even when a non-contact type exposure unit and a photographic dry plate are used for attaining high resolution and high precision exposure.

In the above second embodiment, as in the first embodiment, the photoimageable resist layer portions 2b can be prepared in all shapes and sizes, and with all thicknesses as desired. Furthermore, two or more different photoimageable inks can be used, for instance, alternately, so that a variety of solder masks can be formed, for instance, on the PCB 4, with a different solder mask on each side of the PCB 4.

Such changes or modifications to the process are practically difficult to carry out when the so-called dry film is used for the same reasons as discussed in Example 1.

In the above-mentioned second embodiment of the process of the present invention, when the solder mask is formed on only one side of the PCB, it is unnecessary to reverse one of the photoimageable resist layer bearing film portions to cause the upper surface of each of the photoimageable resist layer portions 2b to come into close contact with both sides of the pattern-formed PCB 4.

Furthermore, the photoimageable resist layer may be in the shape of a continuous layer and it is not necessarily required that the photoimageable resist layer include a plurality of separate photoimageable resist portions 2b as shown in FIG. 7.

Furthermore, in the second embodiment of the process for forming the solder mask of the present invention, for instance, a pair of apparatus 1002 can be used in combination. In one apparatus 1002, a carrier film 1A is used, and in the other apparatus 1002, a carrier film 2A is used. The carrier film 1A and the carrier film 2A may be the same or different.

Figure 10:
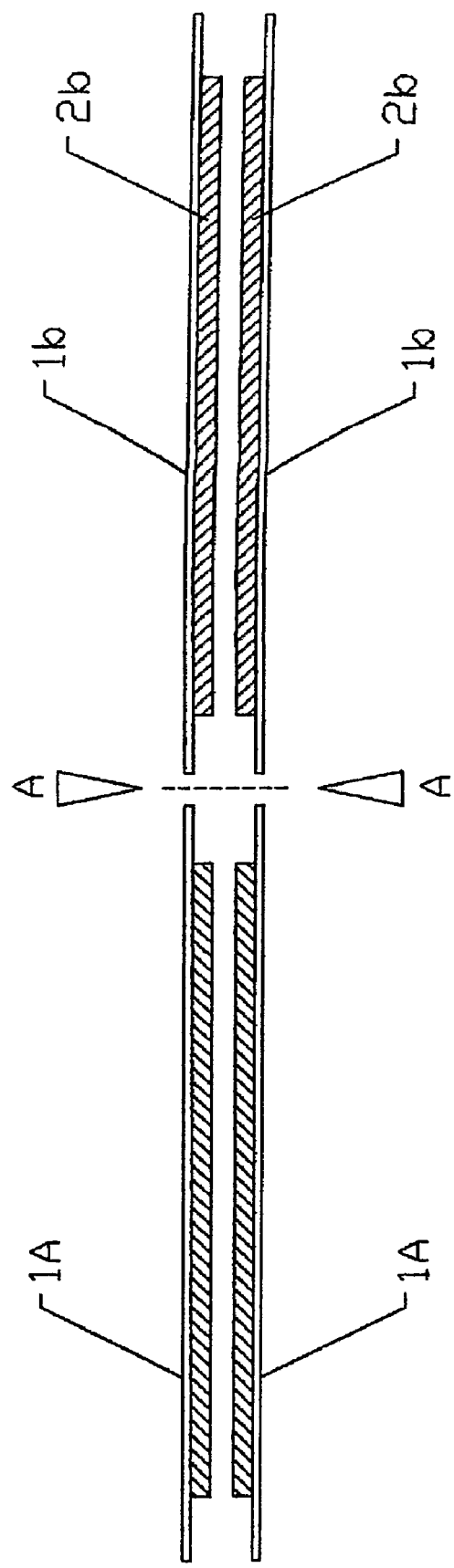
FIG. 10 is a schematic cross-sectional view of an example of a photoimageable resist layer bearing film portion in the second embodiment of the present invention.

In the exactly the same manner as in the second embodiment, the photoimageable resist layer bearing film portion 1b is formed in each of the two apparatus 1002, as shown in FIG. 10, then transported simultaneously or successively onto a pattern-formed PCB 4 so as to bring the upper surface of each of the photoimageable resist layer portions 2b into close contact with both sides of the pattern-formed PCB 4, whereby the pattern-formed PCB 4 is sandwiched therebetween in the same manner as in Example 2 as shown in FIG. 9. Thereafter, the same procedure as in the second embodiment is carried out, whereby the same or different solder mask can also be formed on each of the opposite sides of the PCB 4.

COMPARATIVE EXAMPLE

Figure 11:
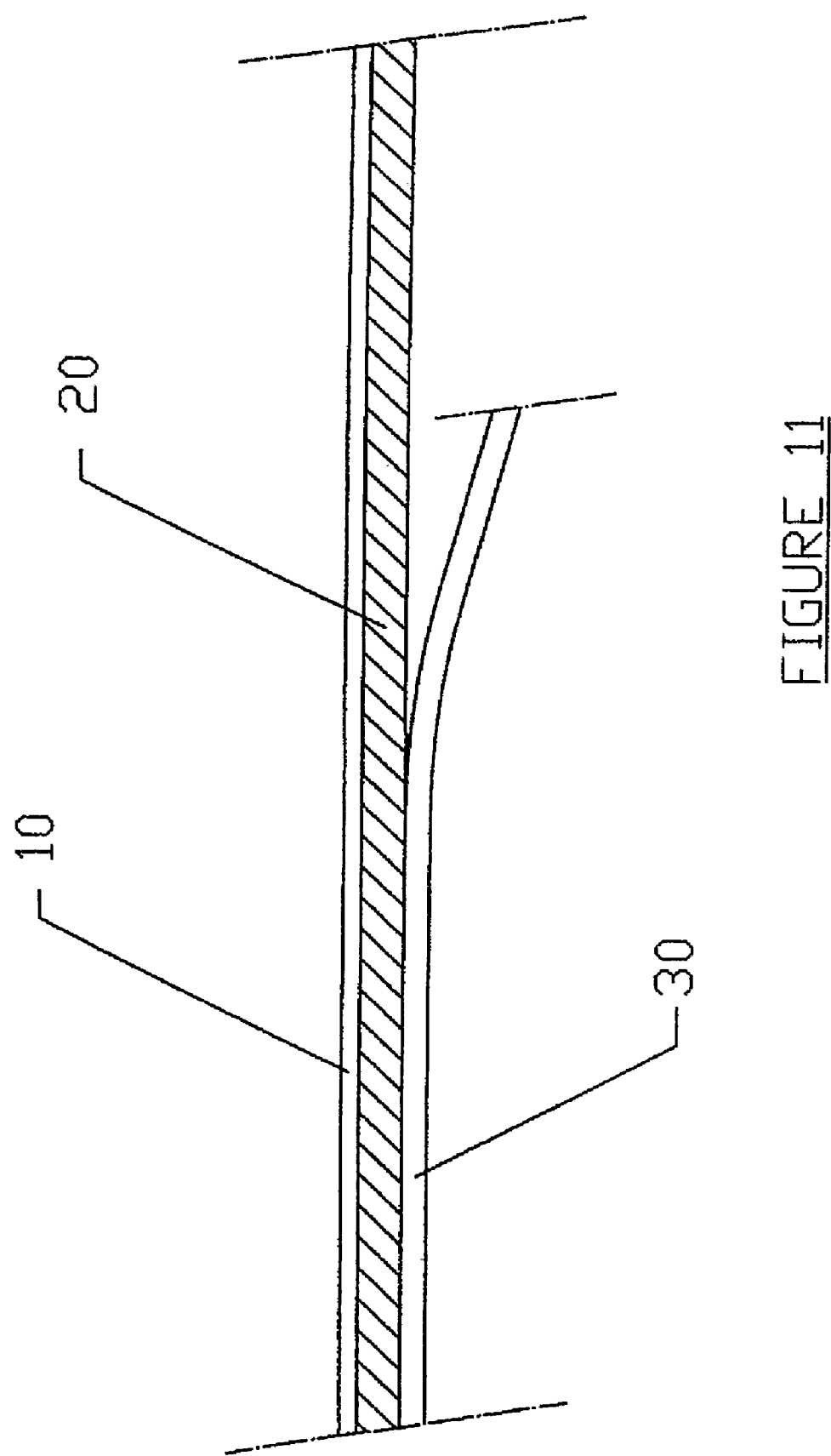
FIG. 11 is a schematic cross-sectional view of a conventional dry film.

A commercially available dry film solder mask (PFR-800 AUS402 with a thickness of 30 μm, made by TAIYO AMERICA, INC.) with a multi-layered structure as shown in FIG. 11 (hereinafter referred to as the dry film), which is preserved in a frozen state, is thawed by allowing it to stand at room temperature.

Figure 12:
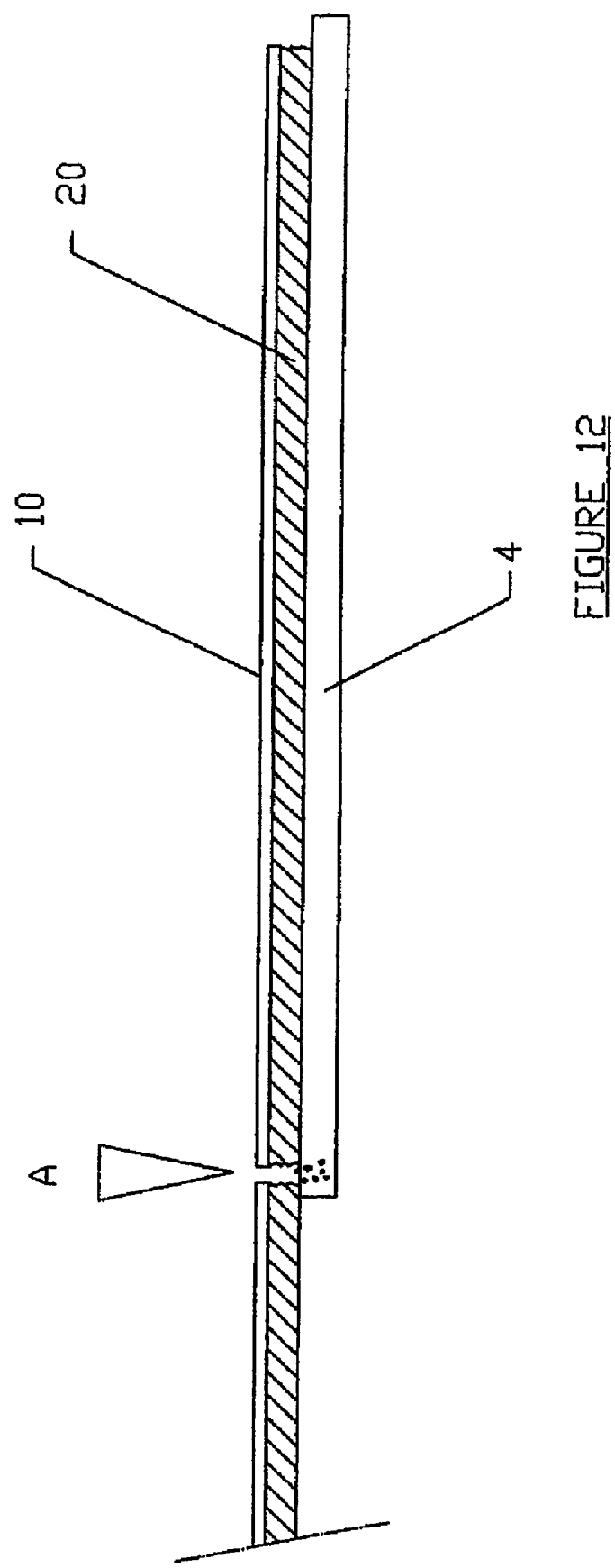
FIG. 12 is a schematic cross-sectional view of the conventional dry film shown in FIG. 11, in the course of laminating the same on a PCB.
Figure 13:
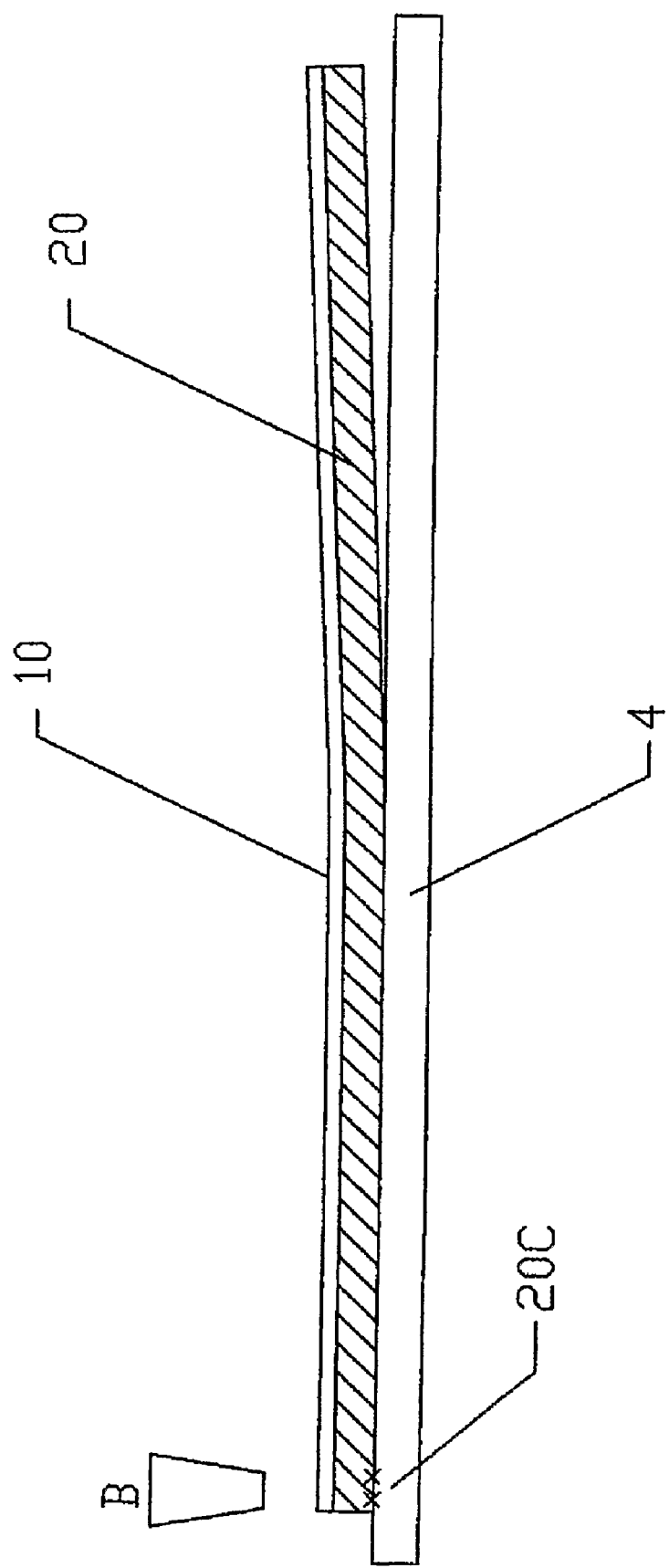
FIG. 13 is a schematic cross-sectional view of a resist layer of the conventional dry film shown in FIG. 11, one end portion of which is tacked to the PCB by a tack bar.

When the temperature of the dry film reached room temperature, the protective layer 30 is peeled away from the resist layer 20. The dry film is then cut off in a predetermined size by a cutter A as shown in FIG. 12. A cut portion is then superimposed on a pattern-formed PCB 4 in such a manner that the upper surface of the resist layer 20 came into contact with the surface of the pattern-formed PCB 4 as shown in FIG. 12. An end portion 2c of the resist layer 20 is then tacked to the PCB 4 by a tack bar B as shown in FIG. 13. By repeating the above-mentioned procedure, the PCB 4 is sandwiched between the two resist layers 20.

The resist layers 20 are laminated on the PCB 4 by a vacuum laminator (VACUUMEX, made by Morton Co. Ltd.) (not shown) at 70° C. for 60 seconds.

The laminated resist layers 20 are then exposed to light imagewise, corresponding to a solder mask to be formed, with the application of exposure energy of 420 mJ/cm$^2$ thereto through the carrier film 10 by a commercially available exposure unit (ORC MODEL HMW680GW EXPOSURE UNIT) (not shown).

The carrier film 10 is then peeled away from the imagewise exposed resist layers 20. The resist layers 20 are then subjected to heat treatment at 80° C. for 5 minutes, and are then cooled until the temperature thereof reached room temperature.

The exposed resist layers 20 are then developed by spraying thereon a 1 wt.% aqueous solution of sodium carbonate at 30° C. with a spray pressure of 2 MPs for 120 seconds, and are then washed with water at 25° C. by spraying water thereon with a spraying pressure of 0.1 MPs for 45 seconds. The thus developed resist layers 20 formed on the PCB 4 are then cured at 150° C. for 60 minutes, whereby a solder mask is formed on each of the opposite sides of the PCB 4.

In the thus fabricated PCB 4 with the solder masks formed on both sides thereof, the filling of blind via-holes and through-holes is found complete and 100% tenting is attained.

Furthermore, the flatness of the solder mask is ±5 μm or less, and there is no "white haze" problem even when a non-contact type exposure unit and a photographic dry plate are used for attaining high resolution and high precision exposure.

In the above embodiments, the substrate may be a rigid substrate or a flexible substrate. Such a substrate may be a rigid printed circuit board, a flexible printed circuit board, or an internal dielectric layer provided with an electric circuit board which can be fabricated in the following Example 3.

EXAMPLE 3

In substantially the same manner as in Example 1, the carrier film 1A is released from the same commercially available carrier film roll (LUMIRROR T-60, made by Toray Industries, Inc., a biaxially oriented polyester film with a film thickness of 38 μm) as that used in Example 1 and transported onto the horizontal, porous vacuum table 101a in the coating chamber 101.

A commercially available dielectric material (HBI-200BC/TA-20BC, a two-component thermally curable ink, made by TAIYO AMERICA, INC.) is coated onto the carrier film 1A by stencil printing in the same manner as in Example 1 to form a dielectric material ink layer.

The thus formed dielectric material ink layer is dried at 80° C. for 30 minutes in the same manner as in Example 1, whereby dielectric material layer portions are formed. Thereafter, by following the same procedures as in Example 1, the dielectric material layer portions are laminated on both sides of the PCB 4 by a vacuum laminator (VACUUMEX, made by Morton Co. Ltd.) (not shown) at 70° C. for 60 seconds.

The dielectric material layer portions are then thermally cured with the application of heat at 150° C. for 60 minutes to form a cured dielectric material layer. The carrier film is then removed from the cured dielectric material layer. The cured dielectric material layer is then subjected to laser drilling to form a laser-drilled cured dielectric material layer with a drilled electric-circuit pattern. The laser-drilled cured dielectric material layer is then subjected to desmear etching. The laser-drilled cured dielectric material layer is plated with copper, whereby an internal dielectric layer provided with an electric-circuit pattern is formed.

For the above-mentioned plating, other conventional electroconductive metals and other electroconductive materials can be employed instead of copper.

Obviously, numerous modifications and variations of the present invention are possible in light of the above teachings. It is therefore to be understood that within the scope of the appended claims, the invention may be practiced otherwise than as specifically described herein.

The invention claimed is:

1. A process for forming a solder mask comprising:
coating a liquid photoimageable ink on a carrier film to form a liquid photoimageable ink layer on said carrier film;
drying said liquid photoimageable ink layer to form a photoimageable resist layer comprising a plurality of separate photoimageable resist layer portions, thereby forming at least one photoimageable resist layer bearing film comprising a plurality of photoimageable resist layer bearing film portions, each of said photoimageable resist layer bearing film portions bearing thereon at least one said photoimageable resist layer portion;

laminating said photoimageable resist layer bearing film on at least one side of a substrate so as to bring the upper surface of said photoimageable resist layer into contact with said substrate;

exposing said photoimageable resist layer to light through said carrier film to form an exposed resist layer;

removing said carrier film from said exposed resist layer;

developing said exposed resist layer to form a developed resist layer;

curing said developed resist layer to form a solder mask on said substrate; and cutting said photoimageable resist layer bearing film into a plurality of said photoimageable resist layer bearing film portions so as to have each of said photoimageable resist layer bearing film portions bear thereon at least one of said separate photoimageable resist layer portions prior to the laminating of said photoimageable resist layer bearing film on at least one side of said substrate.

2. The process for forming a solder mask as claimed in claim 1, wherein in the step of laminating said photoimageable resist layer bearing film on at least one side of a substrate, said photoimageable resist layer bearing film portion is laminated on at least one side of said substrate so as to bring the upper surface of at least one of said photoimageable resist layer portions into contact with said substrate.

3. The process for forming a solder mask as claimed in claim 1, wherein said substrate is a rigid substrate.

4. The process for forming a solder mask as claimed in claim 3, wherein said rigid substrate is a rigid printed circuit board before said solder mask is formed thereon.

5. The process for forming a solder mask as claimed in claim 1, wherein said substrate is a flexible substrate.

6. The process for forming a solder mask as claimed in claim 5, wherein said flexible substrate is a flexible printed circuit board before said solder mask is formed thereon.

7. The process for forming a solder mask as claimed in claim 1, wherein said substrate is an internal dielectric layer provided with an electric-circuit pattern.

8. A process for forming a solder mask comprising:
coating a liquid photoimageable ink on a carrier film to form a liquid photoimageable ink layer on said carrier film;

drying said liquid photoimageable ink layer to form a photoimageable resist layer comprising a plurality of separate photoimageable resist layer portions, thereby forming at least one photoimageable resist layer bearing film comprising a plurality of photoimageable resist layer bearing film portions, each of said photoimageable resist layer bearing film portions bearing thereon at least one said photoimageable resist layer portion;

laminating said photoimageable resist layer bearing film on at least one side of a substrate so as to bring the upper surface of said photoimageable resist layer into contact with said substrate;

exposing said photoimageable resist layer to light through said carrier film to form an exposed resist layer;

removing said carrier film from said exposed resist layer;

developing said exposed resist layer to form a developed resist layer;

curing said developed resist layer to form a solder mask on said substrate; and folding into two a leading edge portion of said photoimageable resist layer bearing film so as to have said substrate sandwiched between said photoimageable resist layer portions of at least one pair of said photoimageable resist layer bearing film portions prior to the laminating of said photoimageable resist layer bearing film on said substrate.

9. The process for forming a solder mask as claimed in claim 8, further comprising:
tacking to said substrate at least one portion of said photoimageable resist layer portions in said folded leading edge portion of said photoimageable resist layer bearing film, prior to the step of laminating said photoimageable resist layer bearing film on said substrate.

10. The process for forming a solder mask as claimed in claim 9, further comprising:
cutting off said folded leading edge portion while said substrate is sandwiched between said photoimageable resist layer portions of at least one pair of said photoimageable resist layer bearing film portions and at least one portion of said photoimageable resist layer portions is tacked to said substrate, prior to the step of laminating said photoimageable resist layer bearing film on said substrate.

11. The process for forming a solder mask as claimed in claim 8, wherein said substrate is a rigid substrate.

12. The process for forming a solder mask as claimed in claim 11, wherein said rigid substrate is a rigid printed circuit board before said solder mask is formed thereon.

13. The process for forming a solder mask as claimed in claim 8, wherein said substrate is a flexible substrate.

14. The process for forming a solder mask as claimed in claim 13, wherein said flexible substrate is a flexible printed circuit board before said solder mask is formed thereon.

15. The process for forming a solder mask as claimed in claim 8, wherein said substrate is an internal dielectric layer provided with an electric- circuit pattern.

16. The process for forming a solder mask as claimed in claim 8, wherein in the step of laminating said photoimageable resist layer bearing film on at least one side of a substrate, said photoimageable resist layer bearing film portion is laminated on at least one side of said substrate so as to bring the upper surface of at least one of said photoimageable resist layer portions into contact with said substrate.

17. A process for forming a solder mask comprising:
coating a liquid photoimageable ink on a carrier film to form a liquid photoimageable ink layer on said carrier film;

drying said liquid photoimageable ink layer to form a photoimageable resist layer comprising a plurality of separate photoimageable resist layer portions, thereby forming at least one photoimageable resist layer bearing film comprising a plurality of photoimageable resist layer bearing film portions, each of said photoimageable resist layer bearing film portions bearing thereon at least one said photoimageable resist layer portion;

laminating said photoimageable resist layer bearing film on at least one side of a substrate so as to bring the upper surface of said photoimageable resist layer into contact with said substrate;

exposing said photoimageable resist layer to light through said carrier film to form an exposed resist layer;

removing said carrier film from said exposed resist layer;

developing said exposed resist layer to form a developed resist layer;

curing said developed resist layer to form a solder mask on said substrate;

interposing said substrate between a pair of said photoimageable resist layer bearing portions so as to bring at least one of said photoimageable resist layer portions born by said photoimageable resist layer bearing portions into contact with at least one side of said substrate, prior to the step of laminating said photoimageable resist layer bearing film on said substrate;

tacking to said substrate at least one portion of said photoimageable resist layer portions while said substrate is interposed between said pair of said photoimageable resist layer bearing portions, prior to the step of laminating said photoimageable resist layer bearing film on said substrate; and cutting off said pair of said photoimageable resist layer bearing portions while said substrate is sandwiched between said photoimageable resist layer portions of at least one pair of said photoimageable resist layer bearing film portions and at least one portion of said photoimageable resist layer portions is tacked to said substrate prior to the laminating of said photoimageable resist layer bearing film on said substrate.

18. The process for forming a solder mask as claimed in claim 17, wherein said substrate is a rigid substrate.

19. The process for forming a solder mask as claimed in claim 18, wherein said rigid substrate is a rigid printed circuit board before said solder mask is formed thereon.

20. The process for forming a solder mask as claimed in claim 17, wherein said substrate is a flexible substrate.

21. The process for forming a solder mask as claimed in claim 20, wherein said flexible substrate is a flexible printed circuit board before said solder mask is formed thereon.

22. The process for forming a solder mask as claimed in claim 17, wherein said substrate is an internal dielectric layer provided with an electric- circuit pattern.

23. The process for forming a solder mask as claimed in claim 17, wherein in the step of laminating said photoimageable resist layer bearing film on at least one side of a substrate, said photoimageable resist layer bearing film portion is laminated on at least one side of said substrate so as to bring the upper surface of at least one of said photoimageable resist layer portions into contact with said substrate.

24. An apparatus for forming a solder mask, comprising:
means for coating a liquid photoimageable ink on a carrier film to form a liquid photoimageable ink layer on said carrier film;
means for drying said liquid photoimageable ink layer to form a photoimageable resist layer comprising a plurality of separate photoimageable resist layer portions, thereby forming at least one photoimageable resist layer bearing film comprising a plurality of photoimageable resist layer bearing film portions, each of said photoimageable resist layer bearing film portions bearing thereon at least one said photoimageable resist layer portion;
means for laminating said photoimageable resist layer bearing film on at least one side of a substrate so as to bring the upper surface of said photoimageable resist layer into contact with said substrate;
means for exposing said photoimageable resist layer to light through said carrier film to form an exposed resist layer;
means for removing said carrier film from said exposed resist layer;
means for developing said exposed resist layer to form a developed resist layer;
means for curing said developed resist layer to form a solder mask on said substrate; and
cutting means for cutting said photoimageable resist layer bearing film into a plurality of said photoimageable resist layer bearing film portions so as to have each of said photoimageable resist layer bearing film portions bear thereon at least one of said separate photoimageable resist layer portions prior to the laminating of said photoimageable resist layer bearing film on at least one side of said substrate.

25. A process for forming an internal dielectric layer provided with an electric-circuit pattern, comprising:
coating a liquid dielectric material ink on a carrier film to form a liquid dielectric material ink layer on said carrier film;
drying said liquid dielectric material ink layer to form a dielectric material layer comprising a plurality of separate dielectric material layer portions, thereby forming at least one dielectric layer bearing film comprising a plurality of dielectric material layer bearing film portions, each of said dielectric material layer bearing film portions bearing thereon at least one said dielectric material layer portion;
laminating said dielectric material layer bearing film on at least one side of a substrate so as to bring the upper surface of said dielectric material layer into contact with said substrate;
thermally curing said dielectric material layer to form a cured dielectric material layer,
removing said carrier film from said cured dielectric material layer;
subjecting said cured dielectric material layer to laser drilling to form a laser-drilled cured dielectric material layer with a drilled electric-circuit pattern;
subjecting said laser-drilled cured dielectric material layer to desmear etching;
plating said laser-drilled cured dielectric material layer with an electroconductive material, thereby forming an internal dielectric layer provided with an electric-circuit pattern; and
one of cutting and folding, said cutting comprises cutting said dielectric material layer bearing film into a plurality of said dielectric material layer bearing film portions so as to have each of said dielectric material layer bearing film portions bear thereon at least one of said separate dielectric material layer portions prior to the laminating of said dielectric material layer bearing film on at least one side of said substrate, said folding comprises folding into two a leading edge portion of said dielectric material layer bearing film so as to have said substrate sandwiched between said dielectric material layer portions of at least one pair of said dielectric material layer bearing film portions prior to the laminating of said dielectric material layer bearing film on said substrate.

26. The process for forming an internal dielectric layer according to claim 25, wherein said electroconductive material is copper.

27. An apparatus for forming a solder mask, comprising:
a coater with which a liquid photoimageable ink is to be coated on a carrier film to form a liquid photoimageable ink layer on said carrier film;
a dryer configured to dry said liquid photoimageable ink layer to form a photoimageable resist layer comprising a plurality of separate photoimageable resist layer portions, thereby forming at least one photoimageable resist layer bearing film comprising a plurality of photoimageable resist layer bearing film portions, each of said photoimageable resist layer bearing film portions bearing thereon at least one said photoimageable resist layer portion;
a laminating device with which said photoimageable resist layer bearing film is to be laminated on at least one side of a substrate so as to bring the upper surface of said photoimageable resist layer into contact with said substrate;
an exposing unit configured to expose said photoimageable resist layer to light through said carrier film to form an exposed resist layer;
a remover with which said carrier film is to be removed from said exposed resist layer;
a developing unit configured to develop said exposed resist layer to form a developed resist layer; and
a curing unit configured to cure said developed resist layer to form a solder mask on said substrate
one of a cutting device and a folding device, said cutting device being configured to cut said photoimageable resist layer bearing film into a plurality of said photoimageable resist layer bearing film portions so as to have each of said photoimageable resist layer bearing film portions bear thereon at least one of said separate photoimageable resist layer portions prior to the laminating of said photoimageable resist layer bearing film on at least one side of said substrate, said folding device being configured to fold into two a leading edge portion of said photoimageable resist layer bearing film so as to have said substrate sandwiched between said photoimageable resist layer portions of at least one pair of said photoimageable resist layer bearing film portions prior to the laminating of said photoimageable resist layer bearing film on said substrate.

* * * * *